United States Patent
Yasunori (10) Patent No.: US 11,061,075 B2
(45) Date of Patent: *Jul. 13, 2021

(54) VOLTAGE MEASUREMENT DEVICE, VOLTAGE MEASUREMENT SYSTEM

(71) Applicants: AutoNetworks Technologies, Ltd., Mie (JP); Sumitomo Wiring Systems, Ltd., Mie (JP); SUMITOMO ELECTRIC INDUSTRIES, LTD., Osaka (JP)

(72) Inventor: Hiromichi Yasunori, Mie (JP)

(73) Assignees: AutoNetworks Technologies, Ltd., Yokkaichi (JP); Sumitomo Wiring Systems, Ltd., Yokkaichi (JP); Sumitomo Electric Industries, Ltd., Osaka (JP)

( * ) Notice: Subject to any disclaimer, the term of this patent is extended or adjusted under 35 U.S.C. 154(b) by 440 days.

This patent is subject to a terminal disclaimer.

(21) Appl. No.: 15/773,449

(22) PCT Filed: Nov. 25, 2016

(86) PCT No.: PCT/JP2016/084957
§ 371 (c)(1),
(2) Date: May 3, 2018

(87) PCT Pub. No.: WO2017/094612
PCT Pub. Date: Jun. 8, 2017

(65) Prior Publication Data
US 2018/0313899 A1   Nov. 1, 2018

(30) Foreign Application Priority Data

Nov. 30, 2015  (JP) .............................. JP2015-233021

(51) Int. Cl.
*G01R 31/3835*  (2019.01)
*H02J 7/14*  (2006.01)
(Continued)

(52) U.S. Cl.
CPC ........ *G01R 31/3835* (2019.01); *B60R 16/033* (2013.01); *G01R 31/006* (2013.01);
(Continued)

(58) Field of Classification Search
CPC . G01R 31/3835; G01R 31/006; H02J 7/0031; H02J 7/0047; H02J 7/0021;
(Continued)

(56) References Cited

U.S. PATENT DOCUMENTS 10,677,851 B2 *  6/2020  Yasunori ................... H02J 7/14
2005/0035656 A1  2/2005  Kuramochi et al.
(Continued)

FOREIGN PATENT DOCUMENTS

JP   S56-157643 A   12/1981
JP   2003-118511 A   4/2003
(Continued)

OTHER PUBLICATIONS

Search Report for PCT/JP2016/084957, dated Feb. 14, 2017.

*Primary Examiner* — Amy He
(74) *Attorney, Agent, or Firm* — Honigman LLP (57) ABSTRACT

A system configured to avoid a power shortage while a vehicle is traveling is provided. A voltage measurement device includes a relay, a first voltage measurement unit measures a first voltage applied to the power supply circuit, a second voltage measurement unit, a power supply circuit, and a control circuit. The power supply circuit is indirectly connected to a direct current bus. A first end of the relay is connected to the direct current bus, whereas a second end is connected to the power storage device. The control circuit, controls opening and closing of the relay, and closes a path between the first end and the second end when the first voltage is lower than or equal to a first threshold value. The second voltage measurement unit measures a second voltage (Continued)

applied to the second end at least when the relay is in an open state.

13 Claims, 6 Drawing Sheets

(51) Int. Cl.
    *H02J 7/00*           (2006.01)
    *B60R 16/033*      (2006.01)
    *G01R 31/00*       (2006.01)

(52) U.S. Cl.
    CPC .......... *H02J 7/0021* (2013.01); *H02J 7/0031* (2013.01); *H02J 7/0047* (2013.01); *H02J 7/14* (2013.01)

(58) Field of Classification Search
    CPC ...... H02J 7/14; H02J 7/007; H02J 1/00; H02J 1/108; H02J 7/00041; H02J 7/0086; H02J 7/045; B60R 16/033; B06R 16/03
    See application file for complete search history.

(56) References Cited

U.S. PATENT DOCUMENTS

| | | |
|---|---|---|
| 2005/0073315 A1 | 4/2005 | Murakami et al. |
| 2014/0239894 A1* | 8/2014 | Mitsutani ................ B60L 53/20 320/109 |

FOREIGN PATENT DOCUMENTS

| | | |
|---|---|---|
| JP | 2013-183561 A | 9/2013 |
| JP | 2014-184752 A | 10/2014 |
| JP | 2014-201234 A | 10/2014 |
| JP | 2015-211576 A | 11/2015 |

* cited by examiner

VOLTAGE MEASUREMENT DEVICE, VOLTAGE MEASUREMENT SYSTEM

CROSS-REFERENCE TO RELATED APPLICATIONS

This application is the U.S. national stage of PCT/JP2016/084957 filed Nov. 25, 2016, which claims priority of Japanese Patent Application No. JP 2015-233021 filed Nov. 30, 2015.

TECHNICAL FIELD

This invention relates to a voltage measurement device, and more particularly, to a technology for measuring an open-circuit voltage of an in-vehicle power storage device.

BACKGROUND

In order to diagnose a power storage device mounted in a vehicle (including a so-called battery or electric double-layer capacitor), it is known to use measurement of an internal resistance. For example, JP 2014-230343A discloses a technology in which a main battery and a sub battery are provided together, and the internal resistance of the sub-battery is measured using the current value and the voltage value at the time at which a smoothing capacitor is charged by the sub-battery.

It is also known that, when diagnosing the power storage device, higher accuracy can be gained by using not only the internal resistance, but also the voltage of the power storage device at the time of opening (open-circuit voltage). However, if the vehicle in which the power storage device is mounted is traveling, the power storage device is charged by an alternator provided in the vehicle, and thus a charging path from the alternator to the power storage device needs to be cut off when the open-circuit voltage is measured.

On the other hand, when supplying power to an electric load mounted in the vehicle, there is a case where a discharge current from not only the alternator but also the power storage device is required while the vehicle is traveling. Also, because this discharging path has a portion in common with the above-mentioned charging path, there is a possibility that the supply of power to the electric load is not sufficiently performed if the charging path is simply cut off.

In view of this, an object of the present invention is to provide a technology that avoids a power shortage while a vehicle is traveling caused by measuring an open-circuit voltage of a power storage device mounted in the vehicle.

SUMMARY

A voltage measurement device measures an open-circuit voltage of a first power storage device that is indirectly connected to a direct current bus connected to a generator and a vehicle load mounted in a vehicle. The voltage measurement device includes: a power supply circuit that is connected to the direct current bus; a first voltage measurement unit configured to measure a first voltage applied to the power supply circuit; a relay that is interposed between the direct current bus and the first power storage device, and has a first end connected to the direct current bus and a second end connected to the first power storage device; a control circuit configured to receive operating power from the power supply circuit, to control opening and closing of the relay, and to close a path between the first end and the second end when the first voltage is lower than or equal to a first threshold value; and a second voltage measurement unit configured to measure a second voltage applied to the second end at least when the relay is in an open state.

Advantageous Effects of Invention

A power shortage while the vehicle is traveling caused by measuring the open-circuit voltage of the power storage device mounted in the vehicle is avoided.

DETAILED DESCRIPTION OF PREFERRED EMBODIMENTS

First Embodiment

Figure 1:
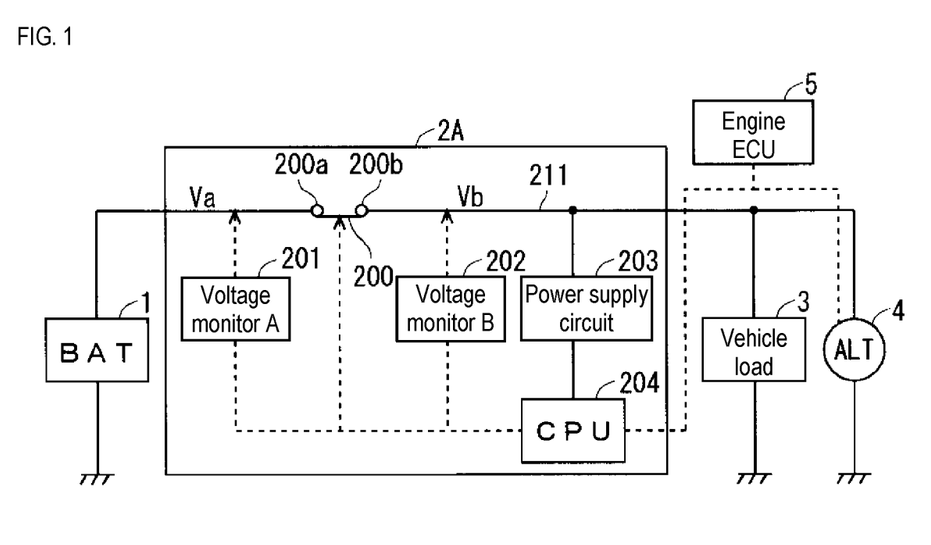
FIG. 1 is a block diagram showing an example of a configuration of a voltage measurement device and surroundings thereof according to a first embodiment.

The following will describe a voltage measurement device 2A according to a first embodiment. FIG. 1 is a block diagram showing an example of a configuration of the voltage measurement device 2A and surroundings thereof. The voltage measurement device 2A has a function for measuring an open-circuit voltage of a power storage device 1 (in the figures, denoted as "BAT") mounted in a vehicle. The power storage device 1 is connected to an alternator 4 (in the figures, denoted as "ALT") via a direct current bus 211.

The alternator 4 functions as an in-vehicle generator that generates electricity with rotation of an engine (not shown), and charges the power storage device 1 through the direct current bus 211 as a charging path. Normally, a positive potential is applied to the direct current bus 211. Note that, a voltage generated by the alternator 4 (generation voltage) is controlled by an ECU (Electronic Control Unit) 5 such that the voltage is set to be a predetermined voltage.

For example, the power storage device 1 may be a lead storage battery, or may be an electric double-layer capacitor. A vehicle load 3 is an electric load that is mounted in the vehicle, and can be supplied with power from either the alternator 4 or the power storage device 1 via the direct current bus 211.

The voltage measurement device 2A includes a relay 200, a power supply circuit 203, voltage measurement units 201 and 202, and a control circuit 204. The power supply circuit 203 is connected to the direct current bus 211, and converts a voltage Vb that is applied from the direct current bus 211, and then applies the converted voltage to the control circuit 204. The voltage Vb is measured by the voltage measurement unit 202 (in the figures, denoted as "Voltage monitor B").

The relay 200 is interposed between the power storage device 1 and the direct current bus 211, and has ends 200a and 200b. That is, the power storage device 1 is indirectly connected to the direct current bus 211 via the relay 200. The end 200a is connected to the power storage device 1, whereas the end 200b is connected to the direct current bus 211. In the relay 200, the path between the ends 200a and 200b is closed (short-circuited) when the voltage Vb is lower than or equal to a first threshold value, whereas the path is opened (open) when the voltage Vb is higher than or equal to a second threshold value. Note that, the first threshold value is lower than the second threshold value. The end 200b and the end 200a can be recognized as a first end and a second end respectively.

The control circuit 204 (in the figures, denoted as "CPU") operates by receiving operating power from the power supply circuit 203. The control circuit 204 can be realized using a well-known microcomputer. A specific first operation of the control circuit 204 is to cause the engine ECU 5 to control the generation voltage of the alternator 4. A specific second operation is to cause the voltage measurement unit 202 to measure the voltage Vb applied to the power supply circuit 203, and control opening and closing of the relay 200 in accordance with the measured voltage value. A specific third operation is to cause the voltage measurement unit 201 (in the figures, denoted as "Voltage monitor A") to measure a voltage Va applied to the end 200a at least when the relay 200 is in an open state. The voltage measurement units 202 and 201 can be recognized as a first voltage measurement unit and a second voltage measurement unit respectively.

Figure 2:
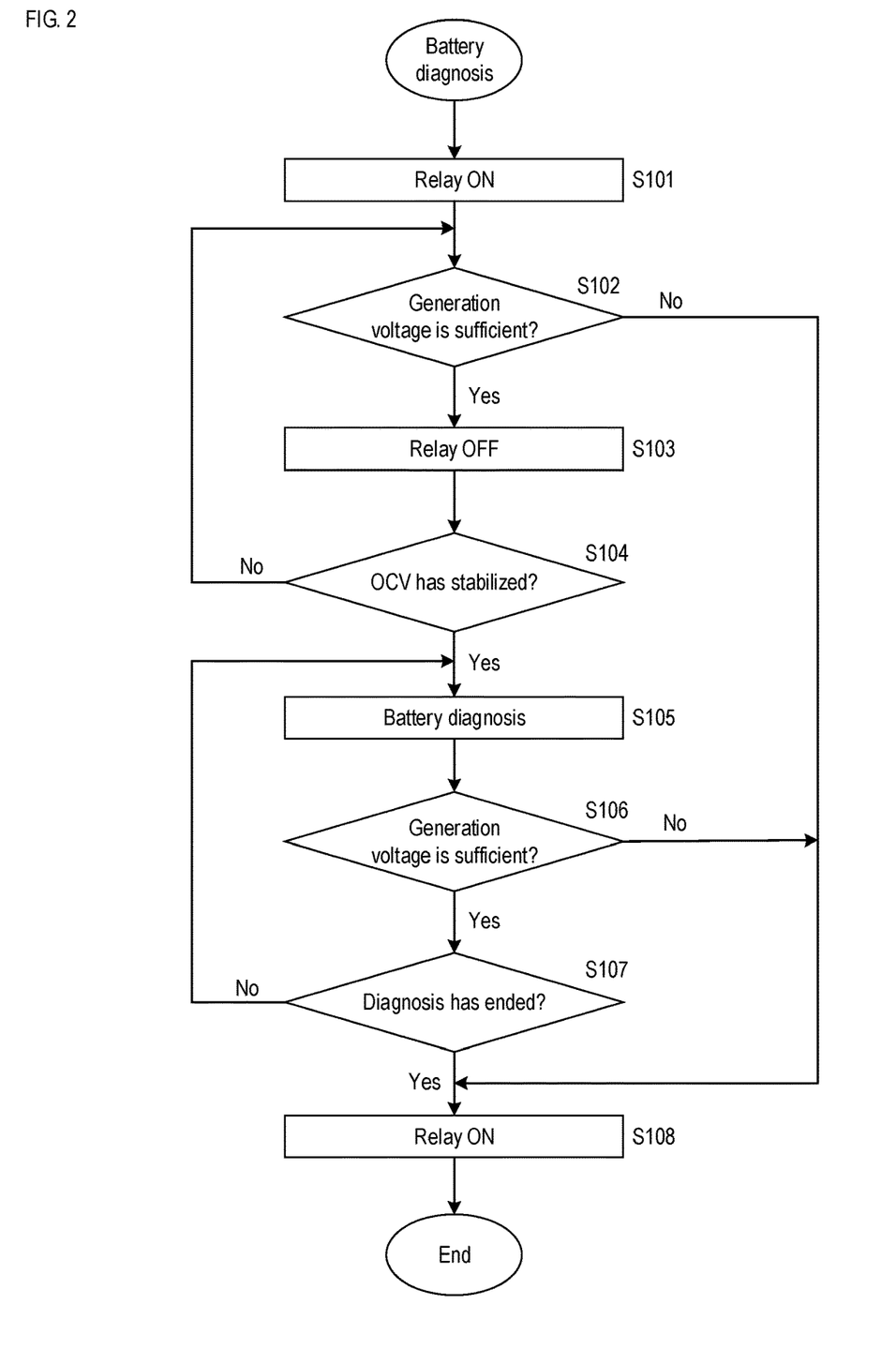
FIG. 2 is a flowchart showing an example of operations of the voltage measurement device according to the first embodiment.

FIG. 2 is a flowchart showing an example of operations of the voltage measurement device 2A according to the first embodiment, and shows control performed by the control circuit 204. Steps S101 to S104, S106, and S108 correspond to the above-mentioned second operation, and steps S105 and S107 correspond to the above-mentioned third operation. In FIG. 2, "Battery diagnosis" means diagnosis of the power storage device 1. This diagnosis includes obtaining the open-circuit voltage of the power storage device 1.

In step S101, the relay 200 is closed (turned ON) once by the control circuit 204. Normally, the power storage device 1 is charged by the alternator 4 via the direct current bus 211 and discharges electricity to the vehicle load 3 via the direct current bus 211, and thus the relay 200 is closed while the vehicle is traveling. Step S101 may be omitted.

After step S101 is executed, in step S102, it is determined whether or not the voltage Vb is higher than or equal to the second threshold value. The second threshold value is a voltage value that is sufficient for supplying power to the vehicle load 3. Such a voltage value can be set in advance according to characteristics of the vehicle load 3. The voltage Vb is a voltage that the alternator 4 generates, and it is determined whether or not the voltage Vb is sufficient for supplying power to the vehicle load 3. Thus, in FIG. 2, it is denoted as "Generation voltage is sufficient?" in step S102. If the determination is affirmative (if the voltage Vb is higher than or equal to the second threshold value), the relay 200 is opened (turned OFF) in step S103. Accordingly, the power storage device 1 is cut off from the vehicle load 3 and the alternator 4, thus not being charged and discharging. In this way, the open-circuit voltage (in the figures, denoted as "OCV") of the power storage device 1 can be measured.

If the determination in step S102 is negative (if the voltage Vb is lower than the second threshold value), the relay 200 is closed in step S108. This is because, when the relay 200 is opened and measurement of the open-circuit voltage starts, it is anticipated that the supply of power to the vehicle load 3 is insufficient because power supply from the power storage device 1 to the vehicle load 3 is lost. To avoid such a power supply shortage, the determination process of step S102 is provided.

Specifically, the open-circuit voltage is the voltage Va that the voltage measurement unit 201 measures when the relay 200 is opened. Of course, the voltage measurement unit 201 may measure the voltage Va when the relay 200 is closed, but measures the voltage Va at least when the relay 200 is opened.

Note that, especially in the case where a chemical battery such as a lead storage battery is employed as the power storage device 1, time is required for the open-circuit voltage of the power storage device 1 to stabilize. Therefore, the battery diagnosis is executed in step S105 after it is determined that the open-circuit voltage has stabilized in step S104. This includes measurement of the voltage Va.

In step S104, it may be determined that the open-circuit voltage has stabilized based on the fact that variation of the voltage Va is within a predetermined range. Also, it may be determined that the open-circuit voltage has stabilized based on the fact that a predetermined time necessary for the open-circuit voltage to stabilize has elapsed since the relay 200 was opened in step S103.

If the determination in step S104 is negative (the determination that the open-circuit voltage has not stabilized), step S102 is executed again, and it is determined whether or not the voltage Vb of the open-circuit voltage is higher than or equal to the second threshold value. In this way, even while waiting for the open-circuit voltage to stabilize, a shortage of power supply to the vehicle load 3 is avoided by executing step S102 again.

Similarly, after the battery diagnosis has started in step S105, it is determined whether or not the voltage Vb is higher than the first threshold value in step S106. The first threshold value is a voltage value that is required for supplying power to the vehicle load 3. This voltage value can be set in advance according to characteristics of the vehicle load 3. If the voltage Vb becomes lower than or equal to the first threshold value during the battery diagnosis, the battery diagnosis is stopped, and the relay 200 is closed in order to enable power supply from the power storage device 1 to the vehicle load 3. That is, if the diagnosis result in step S106 is negative, step S108 is executed.

If the voltage Vb maintains a value higher than the first threshold value during the battery diagnosis, the determination in step S106 is affirmative, and it is determined whether or not the battery diagnosis has ended in step S107. This is a process provided in view of the fact that the diagnosis of the power storage device 1 requires a comprehensive determination not only using the voltage Va of the open-circuit voltage, but also, for example, using the internal resistance of the power storage device 1 that has already been obtained, and thus the diagnosis does not necessarily end after only obtaining the voltage Va. If the determination result in step S107 is negative (if the battery diagnosis has not ended), steps S105 and S106 are repeatedly executed. In this way, even during the battery diagnosis, a shortage of power supply to the vehicle load 3 is avoided by executing step S106 again.

If the determination result in step S107 is affirmative if the battery diagnosis has ended), the relay 200 is closed (turned ON) in step S108 in order to make it possible to charge the power storage device 1 and discharge electricity therefrom.

In this way, because priority is given to the supply of power to the vehicle load 3 of the vehicle during traveling using the first threshold value, a power shortage while the vehicle is traveling caused by measuring the open-circuit voltage of the power storage device 1 is avoided.

Figure 3:
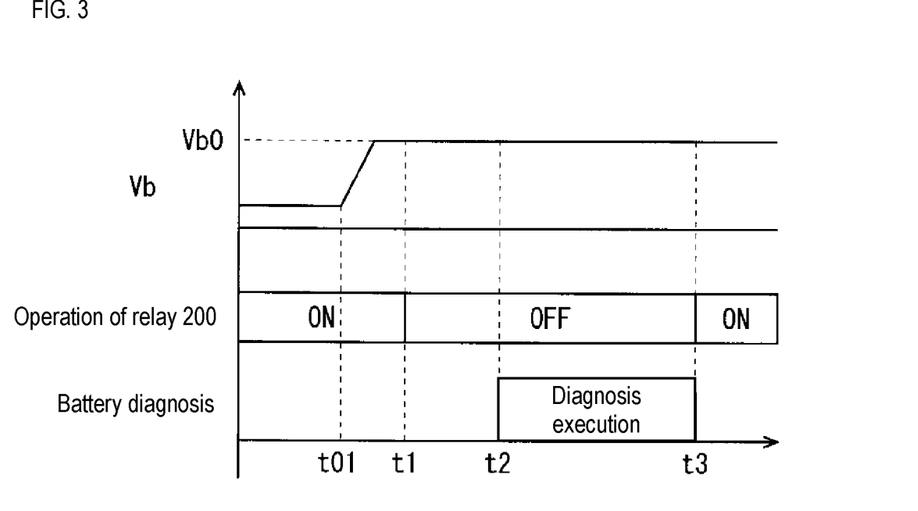
FIG. 3 is a graph showing states of operation of a relay and battery diagnosis according to the first embodiment.
Figure 4:
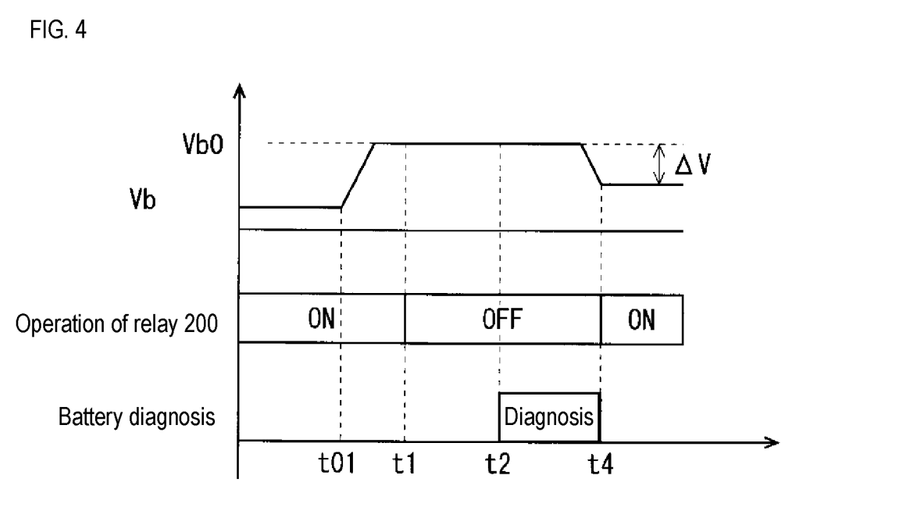
FIG. 4 is a graph showing states of operation of the relay and battery diagnosis according to the first embodiment.

The following will describe the above operations in view of temporal transition. FIGS. 3 and 4 are graphs in which the horizontal axis represents time, and show states of the voltage Vb, operation of the relay 200, and the battery diagnosis. Note that, FIG. 3 shows a case where the diagnosis is not interrupted, whereas FIG. 4 shows a case where the diagnosis is interrupted.

In both of FIGS. 3 and 4, an event corresponding to the above-mentioned first operation occurs at time t01. Specifically, under control of the control circuit 204, the engine ECU 5 instructs the alternator 4 to generate power at a predetermined voltage value Vb0 (>0). Accordingly, the voltage Vb rises and reaches the voltage value Vb0. Steps S102 and S108 are executed until the voltage Vb reaches the second threshold value. The second threshold value is set at the voltage value Vb0 or lower, for example, set at the voltage value Vb0.

In both cases of FIGS. 3 and 4, the voltage Vb reaches the voltage value Vb0 by time t1, and step S103 is executed at the time t1. Accordingly, the relay 200 turns off (opens). After that, steps S104, S102, and S103 are repeatedly executed, and then step S105 is executed at time t2. In this way, both of FIGS. 3 and 4 illustrate a case where the voltage Vb has not become lower than the second threshold value by the time when step S105 is executed after step S103 was executed.

FIG. 3 shows a case where the voltage Vb maintains the voltage value Vb0, and does not become lower than or equal to the first threshold value, which is lower than the second threshold value, until an affirmative determination is obtained in step S107. In this case, the determination result in step S106 is not negative. The affirmative determination is obtained at time t3 in step S107, and then by step S108 being executed, the relay 200 turns on (closes).

FIG. 4 shows a case where a value (Vb0−ΔV) (note that, ΔV>0) is employed as the first threshold value. While steps S105 to S107 are being repeatedly executed, the voltage Vb falls, and reaches the first threshold value at time t4. Accordingly, the determination result in step S106 is negative, and the relay 200 turns on (closes) in step S108. Also, step S108 has been executed before the affirmative determination is obtained in step S107, and thus the battery diagnosis is interrupted.

Note that, it is desirable that the relay 200 is a normally-closed relay. Even if the relay 200 is a normally-closed relay, the above-mentioned operation is not prevented. In a state where the relay 200 is in the open state in the middle of the battery diagnosis, if the power generation capability of the alternator 4 decreases or malfunctions, or the performance of the power supply circuit 203 decreases or malfunctions, then the normally-closed relay 200 is closed, and thus the power storage device 1 can be used to supply power to the vehicle load 3. This is desirable from the viewpoint that the supply of power to the vehicle load 3 in the vehicle in traveling is not prevented.

Second Embodiment

Figure 5:
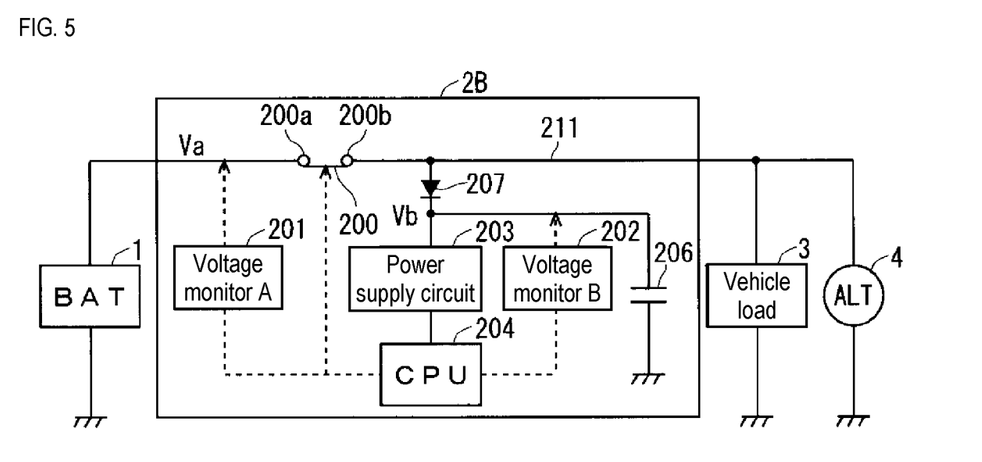
FIG. 5 is a block diagram showing an example of a configuration of a voltage measurement device and surroundings thereof according to a second embodiment.

The following will describe a voltage measurement device 2B according to a second embodiment. FIG. 5 is a block diagram showing an example of a configuration of the voltage measurement device 2B and surroundings thereof. Note that, in the description of this embodiment, constituent elements that are the same as those described in the first embodiment are denoted by the same reference numerals, and description thereof is omitted.

The voltage measurement device 2B has a configuration in which a power storage device 206 and a diode 207 are added to the voltage measurement device 2A. The power storage devices 1 and 206 can be recognized as a first power storage device and a second power storage device respectively. The diode 207 has an anode connected to the direct current bus 211 and a cathode connected to the power supply circuit 203. The voltage Vb is applied from the direct current bus 211 to the power supply circuit 203 via the diode 207.

The cathode of the diode 207 is also connected to the power storage device 206. The power storage device 206 is an electric double-layer capacitor for example, and the capacitance thereof is, for example, a range of about several hundred μF to 1 mF.

The diode 207 prevents the discharging of electricity from the power storage device 206 to the direct current bus 211 while allowing charging from the direct current bus 211 to the power storage device 206. That is, the power storage device 206 does not have a function for supplying power to the vehicle load 3, but has a function for supplying power to the power supply circuit 203.

The voltage measurement unit 202 measures a voltage at the cathode of the diode 207. Similarly to the first embodiment, this voltage is the voltage Vb that is applied to the power supply circuit 203 from the direct current bus 211. Accordingly, the voltage measurement device 2B, similarly to the voltage measurement device 2A, can execute the flowchart shown in FIG. 2, and thus a power shortage while the vehicle is traveling caused by measuring the open-circuit voltage of the power storage device 1 is avoided.

While the vehicle is stopped, the alternator 4 does not generate electricity, but it is necessary to supply power to the vehicle load 3. The current required for such power supply is called dark current, which is required for, for example, wireless communication such as a function of opening a door wirelessly. Normally, a dark current is obtained by discharge from the power storage device 1. But, the dark current is different from a current employed for power supply while the vehicle is traveling in that the necessity for maintaining the dark current is small. Therefore, the open-circuit voltage can be measured in the state where the relay 200 is opened.

However, when the vehicle is stopped, power is not supplied from the alternator 4 to the power supply circuit 203. Accordingly, even if an attempt is made to measure the open-circuit voltage with the relay 200 opened while the vehicle is stopped, the control circuit 204 does not operate. In view of this, in the second embodiment, a technology for measuring the open-circuit voltage of the power storage device 1 even in the case where the vehicle is stopped is illustrated. Because such a technology is described, in FIG. 5, the engine ECU 5 (shown in FIG. 1) that instructs the alternator 4 to generate power at the generation voltage is omitted.

Figure 6:
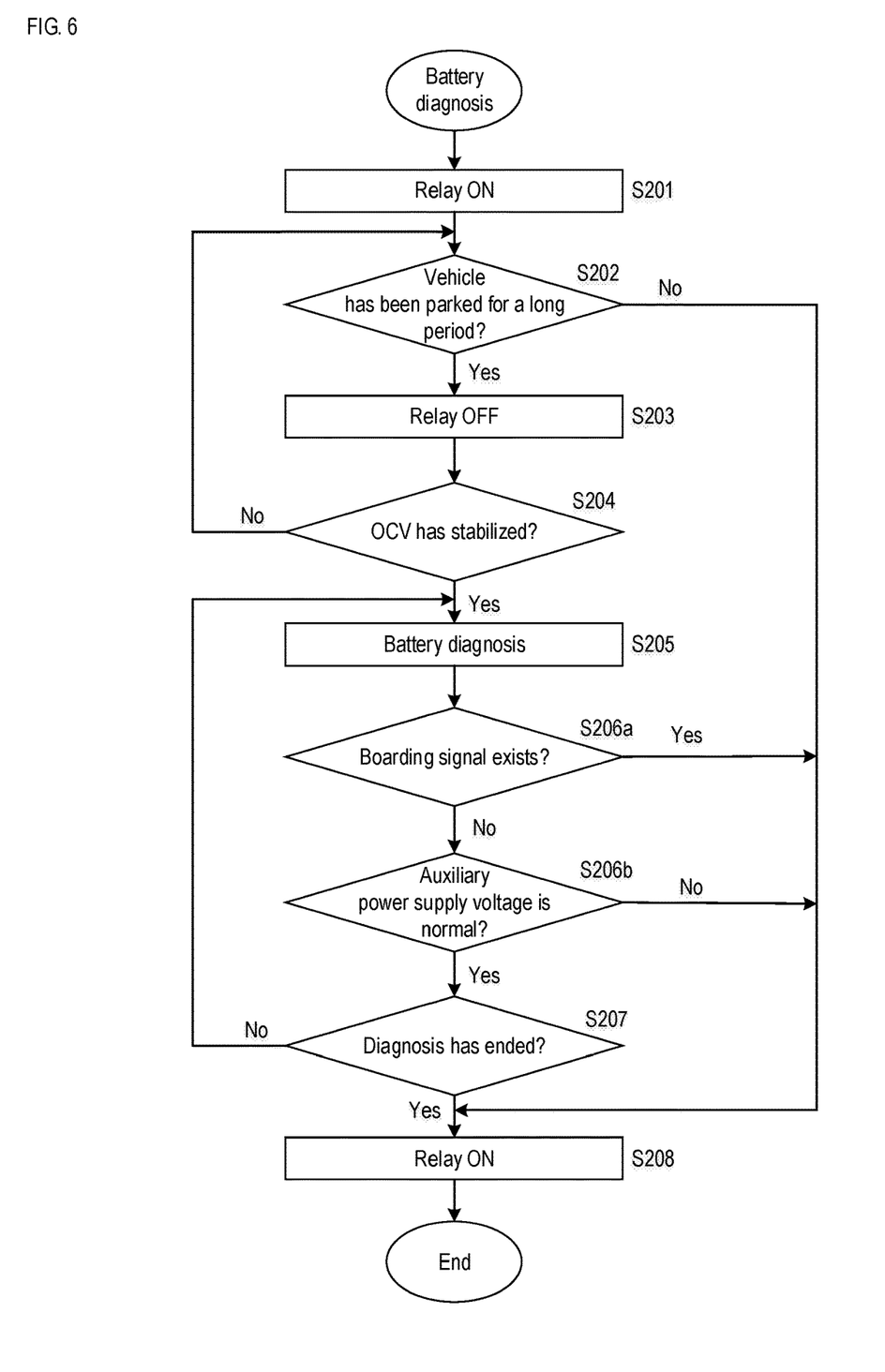
FIG. 6 is a flowchart showing an example of operations of the voltage measurement device according to the second embodiment.

FIG. 6 is a flowchart showing an example of operations of the voltage measurement device 2B according to the second embodiment, and shows control performed by the control circuit 204. Steps S201, S203, S204, S205, S207, and S208 are respectively the same processes as steps S101, S103, S104, S105, S107, and S108 in FIG. 2.

In the second embodiment, instead of step S102 in the first embodiment, steps S202 is executed. In step S202, as a fourth operation, the control circuit 204 determines whether or not the vehicle has been parked for a long period (whether or not having been parked for a predetermined time or longer). Similarly to step S102, if the determination result is affirmative, step S203 is executed, and if the determination result is negative, step S208 is executed.

In step S202, the determination can be made based on whether or not a predetermined time (for example, one hour) has elapsed in a state where the ignition has been turned off, or based on whether or not a predetermined time has elapsed in a state where a current flowing to the direct current bus 211 or the vehicle load 3 has been at a predetermined value or lower (corresponding to a level that is estimated as dark current). Because technologies for detecting that the ignition was turned off and for detecting the current flowing to the direct current bus 211 or the vehicle load 3 are well-known, detailed descriptions thereof will not be given here.

In the second embodiment, after the battery diagnosis has been executed in step S205, steps S206a and S206b are executed instead of step S106 in the first embodiment. In step S206a, it is determined whether or not a boarding signal of the vehicle exists. The boarding signal is a signal anticipating that the vehicle will start traveling. For example, a signal indicating opening of the vehicle door and a signal indicating inserting of an ignition key can be employed. Technologies for generating, transmitting and receiving these signals are also well-known, and thus detailed descriptions thereof will not be given here.

If the boarding signal exists, the determination in step S206a is affirmative, and because it is anticipated that the vehicle will start traveling, similarly to step S106, step S208 is executed. If the boarding signal does not exist, the determination in step S206a is negative, and then step S206b is executed. In step S206b, it is determined whether or not a voltage of the power storage device 206 (in the figure, denoted as "Auxiliary-power-supply voltage") is normal. Here, the auxiliary-power-supply voltage is measured by the voltage measurement unit 202 because it corresponds with the voltage Vb. This auxiliary-power-supply voltage is converted by the power supply circuit 203, and then applied to the control circuit 204. Therefore, if the voltage Vb is higher than or equal to a voltage that is estimated to reach a voltage value required for operating the control circuit 204 by being converted by the power supply circuit 203, it is determined that the auxiliary-power-supply voltage is normal (an affirmative determination is made), and then step S207 is executed. Otherwise (a negative determination is made), step S208 is executed.

In the above-described manner, although the second threshold value is not used in the flowchart in FIG. 6, by employing a value, as the first threshold value, according to which it is determined that the auxiliary-power-supply voltage is normal, the open-circuit voltage can be measured even while the vehicle is stopped.

Figure 7:
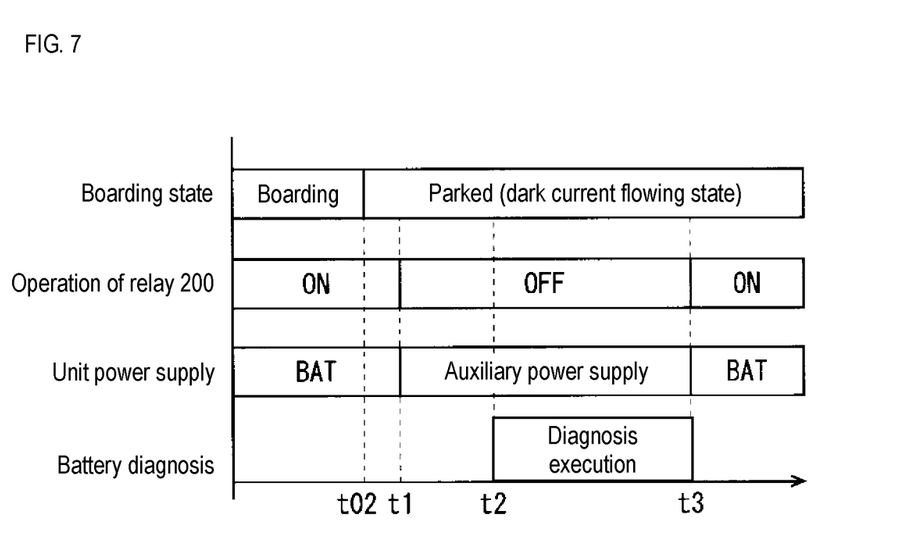
FIG. 7 is a graph showing states of operation of a relay and battery diagnosis according to the second embodiment.
Figure 8:
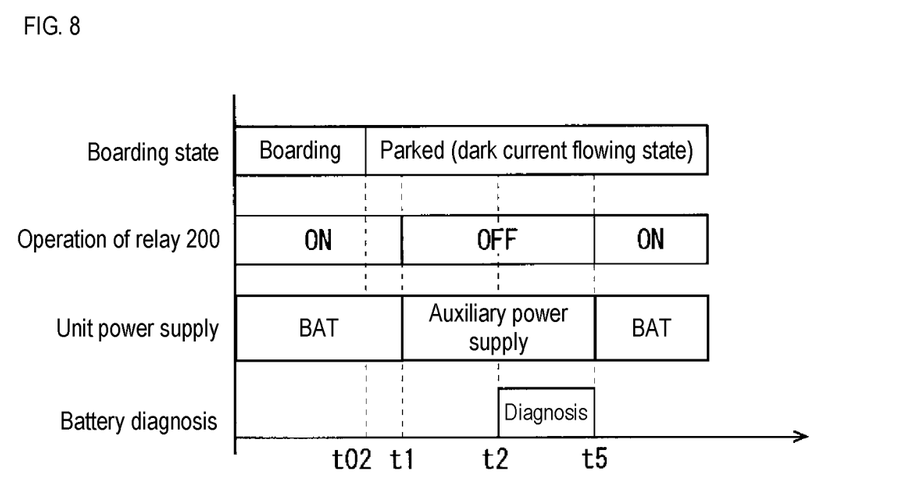
FIG. 8 is a graph showing states of operation of the relay and battery diagnosis according to the second embodiment.

The following will describe the above operations in view of temporal transition. FIGS. 7 and 8 are graphs in which the horizontal axis represents time, and show a boarding state, operation of the relay 200, the type of the power supplies that supply power to the power supply circuit 203 (in the figures, denoted as "Unit power supply",) and a battery diagnosis state. Note that, FIG. 7 shows a case where the diagnosis is not interrupted, and FIG. 8 shows a case where the diagnosis is interrupted.

In both of FIGS. 7 and 8, at time t02, the ignition is turned off (or a current flowing to the vehicle load 3 becomes the dark current level). Then, after the predetermined time has elapsed, the determination result becomes affirmative at time t1 in step S202. Accordingly, step S203 is executed, and the relay 200 turns off (opens). After that, steps S204, S202, and S203 are repeatedly executed, and then step S205 is executed at time t2. In this manner, both of FIGS. 7 and 8 illustrate a case where, after step S203 is executed, interruption of a parking state (for example, occurrence of boarding the vehicle and the like) has not occurred before step S205 is executed.

FIG. 7 shows a case where the boarding signal has not existed and the auxiliary-power-supply voltage has been normal before an affirmative determination is obtained in step S207. In this case, the determination result in step S206a is not negative, and the determination result in step S206b is not affirmative. The affirmative determination is obtained at time t3 in step S207, and step S208 is then executed, and thus the relay 200 turns on (closes).

FIG. 8 illustrates a case where the boarding signal existed or the auxiliary-power-supply voltage was not normal at time t5 before the affirmative determination is obtained in step S207. As a result, the determination result in step S206a is affirmative, or the determination result in step S206b is negative, and then the relay 200 turns on (closes) in step S208. Then, step S208 has been executed before the affirmative determination is obtained in step S207, and thus the battery diagnosis is interrupted.

In this manner, by using the power storage device 206 as the auxiliary power supply, power is supplied to the power supply circuit 203 even while the vehicle is parked, and the open-circuit voltage of the power storage device 1 is measured. In addition, by employing the determination of step S206a, in a case where it is anticipated that the vehicle will start traveling, the power storage device 1 is connected to the vehicle load 3 via the relay 200 and the direct current bus 211, and thus the start of traveling of the vehicle is not prevented. Furthermore, by employing the determination of step S206b, operation failure of the control circuit 204 is avoided.

In this embodiment as well, it is desirable that the relay 200 is a normally-closed relay. This is because, even if the relay 200 is a normally-closed relay, the above-mentioned operation is not prevented, and even if operation failure of the control circuit 204 occurs due to power supply from the power storage device 206 being insufficient, power is supplied from the power storage device 1 to the power supply circuit 203 via the relay 200 that has been closed, thus restoring the operation of the control circuit 204.

Variations

In the first embodiment, whether or not the current flowing to the vehicle load 3 has increased may be employed as the basis of the determination in step S106. This is because, such an increase of the current causes power that is supplied to the vehicle load 3 to be insufficient in the state where the relay 200 is opened. In this case, if the current has increased, step S108 is executed, whereas if the current has not increased, step S107 is executed.

In the second embodiment, the power storage device 206 may be incorporated in the voltage measurement device 2B as illustrated in FIG. 5, or may be provided outside the voltage measurement device 2B. Also, the power storage device 20B and the voltage measurement device 2B can be collectively considered as a voltage measurement system for measuring the open-circuit voltage of the power storage device 1.

The voltage measurement devices 2A and 2B may be incorporated in a relay box mounted in a vehicle, or may be provided between the power storage device 1 and the relay box.

Note that the configurations described in the above embodiments and variations can be appropriately combined as long as there are no contradictions.

Although the invention has been described in detail above, the foregoing description is, in all respects, illustrative, and the invention is not limited to that description. It should be understood that innumerable variations that are not illustrated herein can be conceived without departing from the scope of the invention.

The invention claimed is:

1. A voltage measurement device that measures an open-circuit voltage of a first power storage device that is indirectly connected to a direct current bus connected to an alternator, the alternator charging the first power storage device with the rotation of an engine and a vehicle load mounted in a vehicle, the voltage measurement device comprising:
   a power supply circuit that is connected to the direct current bus;
   a first voltage measurement unit configured to measure a first voltage applied to the power supply circuit;
   a relay that is interposed between the direct current bus and the first power storage device, and has a first end connected to the direct current bus and a second end connected to the first power storage device;
   a control circuit configured to receive operating power from the power supply circuit, to control opening and closing of the relay;
   a second voltage measurement unit configured to measure a second voltage applied to the second end at least when the relay is in an open state; and
   wherein the control circuit closes the relay when the first voltage is lower than or equal to a first threshold value so as to enable power supply from the power storage device to the vehicle load, the first threshold value is a voltage value required for supplying power to the vehicle load.

2. The voltage measurement device according to claim 1, wherein the control circuit opens the path between the first end and the second end when the first voltage is higher than or equal to a second threshold value that is higher than the first threshold value.

3. The voltage measurement device according to claim 2, further comprising a diode having an anode connected to the direct current bus and a cathode connected to the power supply circuit, wherein the cathode of the diode is also connected to a second power storage device.

4. The voltage measurement device according to claim 2, wherein the relay is a normally-closed relay.

5. The voltage measurement device according to claim 1, further comprising a diode having an anode connected to the direct current bus and a cathode connected to the power supply circuit, wherein the cathode of the diode is also connected to a second power storage device.

6. The voltage measurement device according to claim 5, wherein the control circuit opens the path between the first end and the second end when the vehicle has been parked for a predetermined time or longer.

7. The voltage measurement device according to claim 6, wherein the relay is a normally-closed relay.

8. The voltage measurement device according to claim 5, wherein the relay is a normally-closed relay.

9. The voltage measurement device according to claim 1, wherein the relay is a normally-closed relay.

10. A voltage measurement system comprising:
    the voltage measurement device according to claim 5; and
    the second power storage device.

11. The voltage measurement system according to claim 10, wherein the relay is a normally-closed relay.

12. A voltage measurement system comprising:
    the voltage measurement device according to claim 6; and
    the second power storage device.

13. The voltage measurement system according to claim 12, wherein the relay is a normally-closed relay.

* * * * *